(12) United States Patent  
Kitazume

(10) Patent No.: US 7,915,824 B2
(45) Date of Patent: Mar. 29, 2011

(54) ORGANIC EL DISPLAY DEVICE AND METHOD FOR MANUFACTURING THE SAME

(75) Inventor: Eiichi Kitazume, Tokyo (JP)

(73) Assignee: Toppan Printing Co., Ltd. (JP)

( * ) Notice: Subject to any disclaimer, the term of this patent is extended or adjusted under 35 U.S.C. 154(b) by 220 days.

(21) Appl. No.: 12/211,788

(22) Filed: Sep. 16, 2008

(65) Prior Publication Data

US 2009/0128014 A1  May 21, 2009

(30) Foreign Application Priority Data

Nov. 16, 2007 (JP) ................................ 2007-298399

(51) Int. Cl.
H05B 33/04 (2006.01)
(52) U.S. Cl. .......................... 313/512; 313/504; 445/25
(58) Field of Classification Search .................. 257/40, 257/72, 98–100, 642–643, 759; 313/498–512; 315/169.1, 169.3; 427/58, 64, 66, 532–535, 427/539; 428/690–691, 917; 438/26–29, 34, 82; 445/24–25

See application file for complete search history.

(56) References Cited

U.S. PATENT DOCUMENTS

2007/0170446 A1* 7/2007 Cho et al. ...................... 257/98
2007/0241665 A1* 10/2007 Sakanoue et al. ............ 313/503

FOREIGN PATENT DOCUMENTS

JP         09-063771         3/1997

* cited by examiner

*Primary Examiner* — Nimeshkumar D Patel
*Assistant Examiner* — Donald L Raleigh
(74) *Attorney, Agent, or Firm* — Squire, Sanders & Dempsey (US) LLP

(57) ABSTRACT

An organic EL display device includes a substrate, a plurality of first electrodes formed on the substrate, a plurality of partition walls for sectioning the first electrodes and for locating the first electrodes in different pixels, a hole transport layer including an inorganic layer, the hole transport layer formed on the first electrode, an organic light emitting layer formed on the hole transport layer, and a second electrode covering an entire surface of the hole transport layer with the organic light emitting layer.

19 Claims, 9 Drawing Sheets

ORGANIC EL DISPLAY DEVICE AND METHOD FOR MANUFACTURING THE SAME

CROSS REFERENCE TO RELATED APPLICATION

This application claims priority to Japanese application number 2007-298399, filed on Nov. 16, 2007, which is incorporated herein by reference.

BACKGROUND OF THE INVENTION

1. Field of the Invention

The present invention is related to an organic EL (electroluminescence) display device and a method for manufacturing the device. Especially, the present invention is related to an organic EL display device and a method for manufacturing the device, in which the device has no display defect and has improved durability by forming a second electrode covering the entire surface of an inorganic material pattern.

2. Description of the Related Art

An organic EL element emits light when a current is supplied to a light emitting layer which is formed from an organic light emitting material and between two opposed electrodes. In order to manufacture an element of high efficiency and high reliability, a film thickness of the light emitting layer is important factor. In the case of forming a color display using the organic EL element, it is necessary to perform patterning on the organic EL element with high definition.

Low molecular materials and polymeric materials are examples of organic luminescent materials that can be used to form the organic luminous layer. Generally, as for low molecular materials, thin film can be formed by vacuum evaporation. A mask with minute patterns is used at this time, and patterns are formed. In a manufacturing method with the use of vacuum processing such as vacuum evaporation, upsizing of a substrate can diminish the accuracy of the patterning. In addition, throughput is low because a layer is formed in vacuum.

Thus the following method is tried recently. Polymer organic luminescent material is dissolved in a solvent, and ink is made. This ink is used, and thin film is formed by a wet coating method.

A layer structure of an organic light emitting medium layer when an organic light emitting medium layer including an organic light emitting layer is formed by wet coating using coating solution of high polymer materials is described below. The two-layer construction in which a hole transport layer and an organic light emitting layer are laminated on an anode side is generally used. As for the organic light emitting layer, it is necessary for the organic light emitting inks including organic light emitting materials of red (R) green (G) and blue (B) in a solvent to be separately applied in order to form a color panel.

However, separated application of materials other than light emitting materials is not generally performed. Thereby, a solid film as a common layer for all colors is sufficient. High definition patterning is not necessary. Then, in order to form a hole transport layer, polymer is formed by a wet coating method, a low molecular organic material is deposited by a vacuum vapor deposition method, or a film made from an inorganic material is formed by a vacuum vapor deposition method, a sputtering method, a CVD method or other film formation methods. Among them, especially in the case of an inorganic material, there are problems in which a composition ratio or a structure of an inorganic material changes when an inorganic material is dissolved in water or is oxidized.

In order to solve this problem, bad influence is reduced by sealing a device (an organic EL element) in an inactive gas under a condition where an amount of moisture or oxygen is strictly controlled. However, reaction by remaining moisture or oxygen in gas occurs. Thereby, non-light emitting area called dark spots is generated. So, this process is insufficient. Especially, reaction occurs in a place where the place is not covered by other film, and the reaction reaches a display region.

In a patent document 1 (JP 2824411 B2), a technology in which a metal oxide is used for an inorganic material is disclosed.

As shown in FIG. 6, a conventional organic EL display device 400 includes, for example, an inorganic hole transport layer 33, an organic light emitting layer (not illustrated in figures) and a counter electrode 32 on a display region 30 in which a plurality of pixel electrodes 31 are provided. Among them, in the case where a hole transport layer 33 including an inorganic hole transport material is formed on a display region 30, pattern of a hole transport layer 33 is formed by a vacuum vapor deposition method, a sputtering method, a CVD method or the like, in which a shape of the pattern is a shape except for a place of a driver IC, a contact part of a counter electrode 32, an adhesive part for a sealing member and the like. Thereafter, a pattern of a counter electrode 32 is formed. At this time, the pattern of a counter electrode 32 is as follows: the pattern of a counter electrode 32 is different from a pattern of an inorganic hole transport layer 33; and a pattern of a hole transport layer 33 is larger than a pattern of a counter electrode 32, in which a hole transport layer is used as an insulating film under a counter electrode 32 in order to prevent short-circuit between a counter electrode 32 and pixel electrode 31 arranged on a substrate from occurring. In these cases, there is region where a hole transport layer 33 is not covered.

The following problem was found: as shown in FIG. 7, a part where a hole transport layer 33 is not covered by a counter electrode 32 reacts with oxygen or moisture 37; the reaction region reaches a display region 30 at early time; and this causes non-light emitting part called dark spots. Especially, in the case of an inorganic hole transport layer by which EL characteristics are found to be improved, it was found that this problem is remarkable.

An object of the present invention is to provide an organic EL display device and a method for manufacturing the device, in which display defects (display failures) do not occur and durability is improved because dark spots are not generated. This is because a film surface and an end part of an inorganic layer do not react with oxygen or moisture by forming a second electrode covering the entire surface of a film using an inorganic material.

SUMMARY OF THE INVENTION

One embodiment of the present invention is an organic EL display device including a substrate, a plurality of first electrodes formed on the substrate, a plurality of partition walls for sectioning the first electrodes and for locating the first electrodes in different pixels, a hole transport layer including an inorganic layer, the hole transport layer formed on the first electrode, an organic light emitting layer formed on the hole transport layer, and a second electrode covering an entire surface of the hole transport layer with the organic light emitting layer.

In these drawings, 1 is a display region; 2 is a counter electrode; 3 is a hole transport layer including an inorganic layer; 4 is a display device; 5 is a substrate; 6 is an active layer; 7 is a gate insulating film; 8 is a gate electrode; 9 is an interlayer dielectric; 10 is a drain electrode; 11 is a scanning line; 12 is a source electrode; 13 is a pixel electrode; 14 is a partition wall; 16 is an interlayer layer; 17 is an organic light emitting layer; 19 is an ink tank; 20 is an ink chamber; 21 is an anilox roll; 211 is an ink layer; 22 is a printing plate; 23 is a plate cylinder; 24 is a substrate (a substrate to be printed); 25 is a flat base; 26 is an organic light emitting medium layer; 27 is oxygen or moisture; 30 is a display region; 31 is a pixel electrode; 32 is a counter electrode; 33 is a hole transport layer including an inorganic layer; 34 is a display device; 36 is an organic light emitting layer; 37 is oxygen or moisture; 50 is a metal mask; 100 is an active matrix driving type organic EL display device; 200 is a passive matrix driving type organic EL display device; and 300 is a relief printing apparatus; and 400 is a conventional active matrix driving type organic EL display device.

DETAILED DESCRIPTION OF THE INVENTION

Hereinafter, embodiments of the present invention are described referring to the figures. In addition, the figures are used for explaining the following embodiments. However, size, thickness, dimension and the like of respective parts is different from those of factual parts. In addition, the present invention is not limited to these.

Figure 1:
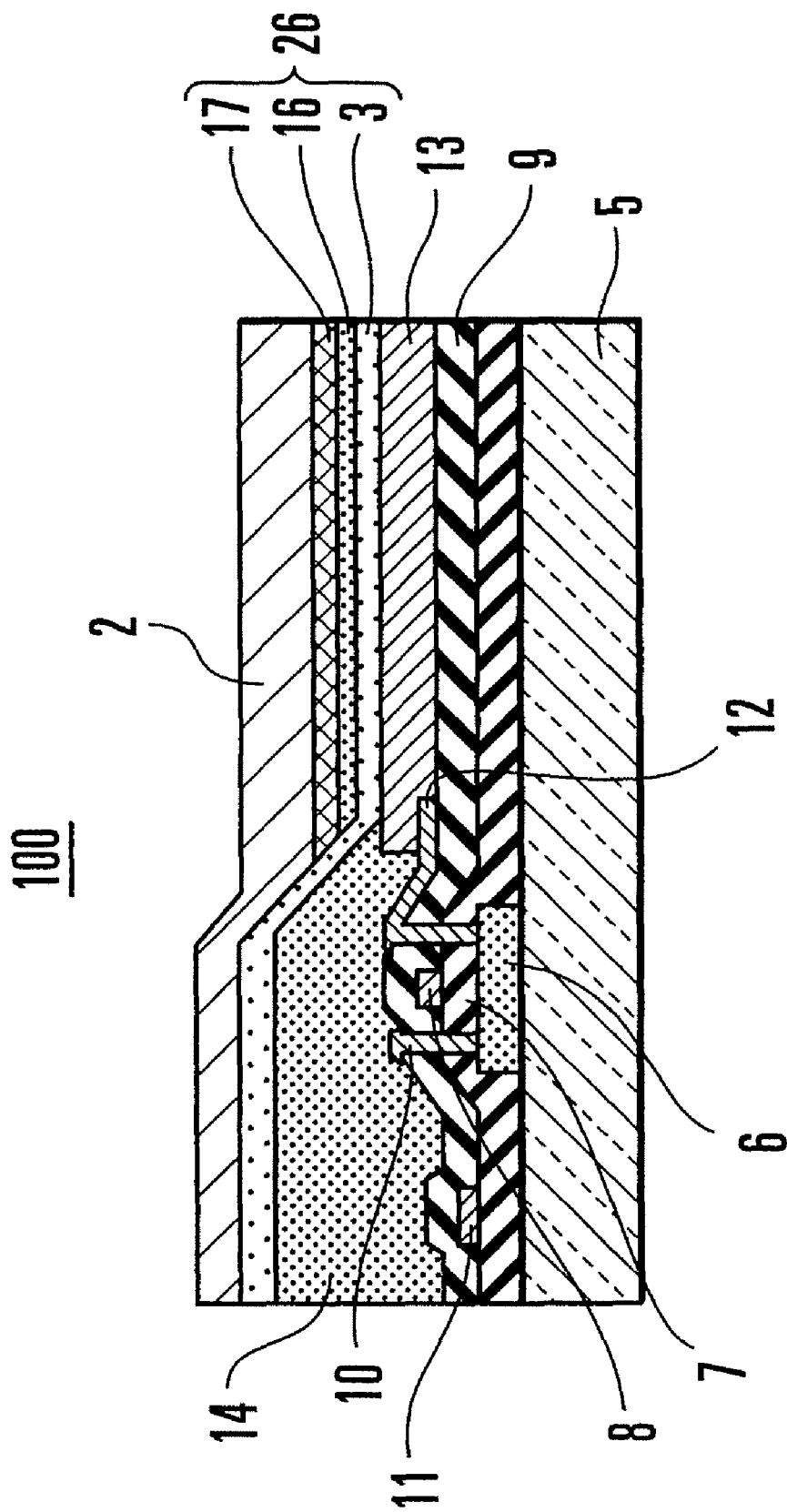
FIG. 1 is a schematic cross-sectional diagram of an organic EL display device of an embodiment of the present invention.

As shown in FIG. 1, an organic EL display device 100 in an embodiment of present invention includes substrate 5 with thin film transistors (TFT), pixel electrodes 13 in which a thin film transistor is provided for every pixels, partition walls 14 sectioning pixels, a hole transport layer including an inorganic layer over the pixel electrodes 13, an interlayer layer 16 formed on the hole transport layer 3, an organic light emitting layer formed on the interlayer layer 16 and a counter electrode 2 over the organic light emitting layer, the electrode 2 covering the entire surface. Here, a hole transport layer 3, an interlayer layer 16 and an organic light emitting layer 17 are called an organic light emitting medium layer 26.

Figure 2:
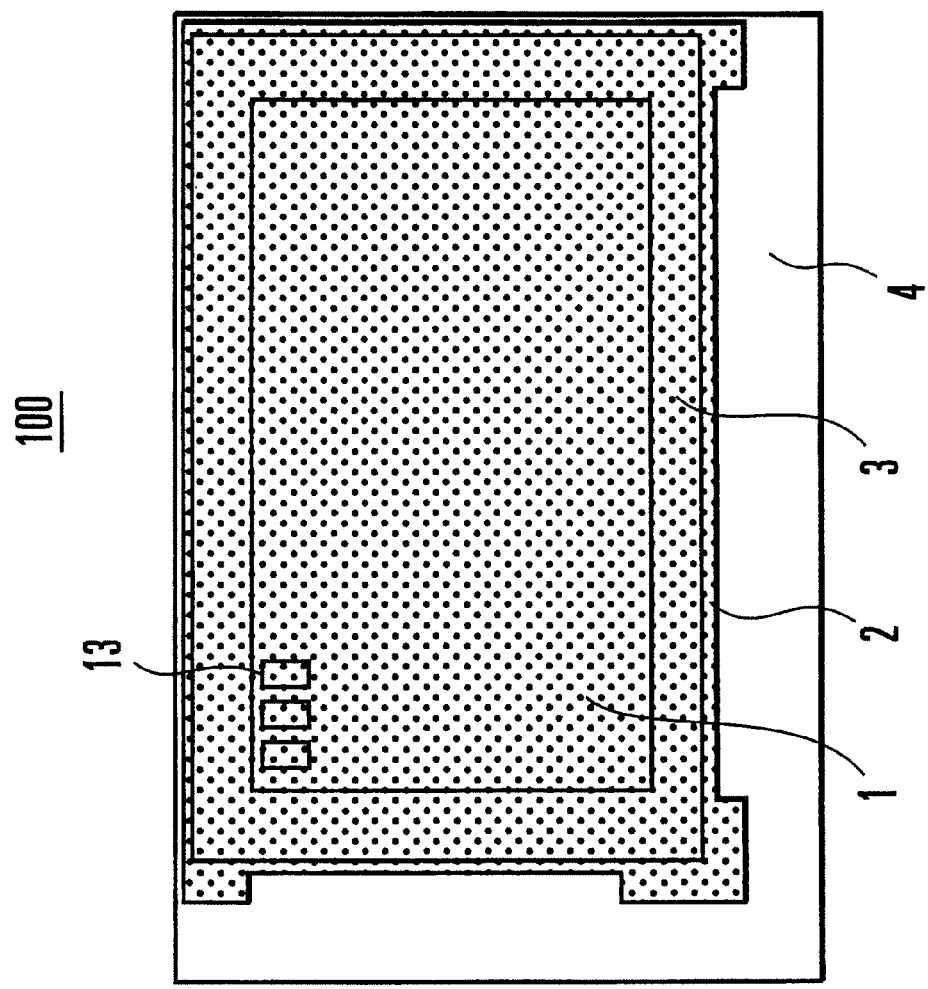
FIG. 2 is a schematic top view of an active matrix driving type organic EL display device of an embodiment of the present invention.

FIG. 2 is a schematic top view of FIG. 1. FIG. 2 shows a display device 4 including a display region 1, pixel electrodes 13, inorganic layer of an organic light emitting medium layer 26 and a counter electrode 2.

[Substrate 5]

As shown in FIG. 1, a substrate (a back plane) 5 used for an organic EL display device 100 of an embodiment of the present invention is provided with a TFT (a thin film transistor) and a first electrode (a pixel electrode) 13 wherein the TFT is electrically connected with the first electrode 13.

The TFT and the organic EL display device 100 formed above the TFT are supported by the substrate 5. The substrate may preferably be excellent in mechanical strength, insulating property and dimensional stability.

For example, the following materials can be used as the substrate 5:

1. glass, quartz, plastic film or sheet such as polypropylene, polyether sulfone, polycarbonate, cyclo olefin polymers, polyarylate, polyamide, polymethyl methacrylate, polyethylene terephthalate and polyethylenenaphthalate;
2. transparent substrate in which plastic film or sheet is laminated by only monolayer or plural layers comprised of the following materials:
   metallic oxide such as oxidation silicon and alumina;
   metal fluoride such as aluminium fluoride and magnesium fluoride;
   metal nitrides such as silicon nitride and aluminum nitride;
   metal acid nitride such as oxynitriding silicon;
   macromolecule resin film such as acrylic resin, epoxy resin, silicone oil and polyester resin; and
   metallic foil, sheet or board made of aluminium or stainless, and
3. non-transparent substrate in which plastic film or sheet is laminated by a metal membrane such as aluminium, copper, nickel and stainless.

However, the material for the substrate 5 is not limited to these.

The transparent property of the substrate 5 is decided by the direction in which light comes out. It is necessary for the substrate 5 comprised of these materials to avoid entry of moisture to an organic EL display device 100. For example, an inorganic film is formed on the substrate 5. Alternately, fluorocarbon resin is applied to the substrate 5. That is, it is desirable that exclusion of moisture and hydrophobic processing for the substrate 5 are performed in this way. Particularly it is desirable to lower moisture content and gas transmission coefficient of the substrate 5 to avoid entry of moisture to an organic light emitting media layer 26 (the layer 26 is described below).

For a thin film transistor provided on the substrate 5 in an embodiment of the present invention, well-known thin film transistors can be used. For example, a thin film transistor having the active layer 6 where a source/drain region 10, 12 and a channel area are formed, the gate insulating film 7 and the gate electrode 8 is exemplified. Configuration of a thin film transistor is not limited to this configuration. For example, staggered type, reverse staggered type, top gate type, and coplanar type are exemplified.

Active layer 6 can encompass many embodiments. By way of example only, it can be formed by inorganic semiconductor materials such as amorphous silicon, polycrystalline silicon, crystallite silicon, cadmium selenide and metal oxide, or organic semiconductor materials such as thiophene oligomer, and poly(phenylene vinylene).

A manufacturing method of these active layers is exemplified below: a method performing ion doping after depositing amorphous silicon by plasma CVD method; a method performing ion doping by ion implantation method after forming poly silicon by crystallization of amorphous silicon by solid phase epitaxy after forming amorphous silicon by LPCVD (low pressure CVD) method using $SiH_4$ gas; a method performing ion doping by ion doping method after forming poly silicon by annealing amorphous silicon using a laser such as excimer laser and crystallization of amorphous silicon after forming amorphous silicon by LPCVD method using $Si_2H_6$ gas or PECVD (plasma enhanced CVD) method using $SiH_4$ gas (low temperature process); and a method performing ion doping by ion implantation method after forming a gate electrode 8 of $n^+$ poly silicon on a gate insulating film after forming a gate insulating film by thermal oxidation at a temperature of 1,000 degree Celsius or more after depositing poly silicon by LPCVD or PECVD (high temperature process).

For a gate insulating film 7 in an embodiment of the present invention, a conventional gate insulating film can be used. For example, $SiO_2$ formed by PECVD method or LPCVD method, $SiO_2$ obtained by thermal oxidation of poly silicon film can be used.

For gate electrode 8 in an embodiment of the present invention, a conventional gate electrode can be used. Metal such as aluminum and copper, refractory metal such as titanium, tantalum and tungsten, poly silicon, silicide of refractory metal, or polycide can be used. However, the gate electrode is not limited to these.

For a thin film transistor in an embodiment of the present invention, a single gate structure, a double gate structure, multiple gating configuration having three or more gate electrodes are exemplified. In addition, even LDD configuration and offset configuration are preferable. Even more particularly, two or more thin film transistors may be placed on one pixel.

In some embodiments of the present invention, it is necessary for the thin film transistor to be connected so that thin film transistor functions as a switching element of an organic EL display device 100. Drain electrode 10 of the thin film transistor is electrically connected with pixel electrodes 13 of an organic EL display device 100.

[Pixel Electrode 13]

As shown in FIG. 1, in an embodiment of the present invention, pixel electrode 13 which is a first electrode is formed on substrate 5. Patterning of pixel electrode 13 is performed if necessary. Pixel electrode 13 may be sectioned by partition wall 14 so that pixel electrode 13 corresponds to respective pixels.

Materials of pixel electrode 13 are described below: metal complex oxide such as ITO (indium tin complex oxide), indium zinc complex oxide or zinc aluminium complex oxide; metallic substances such as gold, platinum and chromium; and the particle dispersion membrane in which finely divided particles of the metallic oxide or the metallic substance are dispersed in epoxy resin or acrylic resin. A single-layered body or a laminated material of the above described material can be used. However, materials of pixel electrode 13 are not limited to these.

When a pixel electrode 13 is an anode, it is desirable to select the material such as ITO which has a high work function. In the case of a so-called bottom emission configuration in which light is taken out from a lower side (the substrate 5 side), it is necessary to select a material with translucency as a material of a pixel electrode 13. Metallic substances such as copper or aluminium may be added as a supporting electrode to make an electric wiring electrical resistance of a pixel electrode 13 small if necessary. Here, in the case of a so-called top emission configuration in which light is taken out from a upper side (an opposite side of the substrate 5 side), a counter electrode can be formed on the substrate at first.

For a formation method of a pixel electrode 13, the following methods can be used depending on the material: dry methods such as resistance heating evaporation method, electron-beam evaporation technique, reactivity evaporation method, ion plating method and sputtering method; and wet methods such as the gravure process and screen printing. However, a formation method of a pixel electrode 13 is not limited to these.

For a patterning method of a pixel electrode 13, depending on a material and a film formation method, existing patterning methods such as mask evaporation method, photolithography method, wet etching method and dry etching method can be used. In a case where a product with a TFT is used as a substrate, the product with a TFT should be formed so that a pixel electrode is electrically connected to a corresponding pixel in a lower layer.

[Partition Wall 14]

Partition wall 14 can be formed so as to section a light emitting area corresponding to a respective pixel. It is desirable that the partition wall be formed so as to cover an edge of pixel electrode 13. (See FIG. 1) In an active matrix drive-type organic EL display device 100, pixel electrode 13 is generally formed for every pixel and the respective pixel tends to occupy as large an area as possible. Therefore, the most preferable shape of a partition wall 14 to be formed so as to cover an edge of a pixel electrode is basically a grid shape where a partition wall 14 sections at the shortest distance each pixel electrode 13.

For a formation method of a partition wall 14, the following conventional method can be used: 1). An inorganic film is uniformly formed on a substrate (with a thin film transistor and a pixel electrode), this substrate is masked with a resist, and dry etching of an inorganic film is performed; or 2). A photosensitive resin is laminated on a substrate, and a predetermined pattern is formed by a photolithography method. However, a formation method of a partition wall 14 is not limited to these. Water-repellent may be added if necessary. By means of irradiating plasma or UV on a partition wall after the formation of a partition wall, a partition wall can be ink repellent.

Height of a partition wall 14 is preferably 0.1 μm-10 μm, more preferably 0.5 μm-2 μm. If a partition wall is higher than 10 μm, a partition wall may prevent a counter electrode 2 from forming and prevent sealing. If a partition wall is lower than 0.1 μm, a partition wall can not perfectly cover an edge of a pixel electrode 13, or color mixture or short circuit between adjacent pixels occurs when an organic light emitting medium layer 26 is formed.

[Organic Light Emitting Medium Layer 26]

An organic light emitting medium layer 26 in an embodiment of the present invention includes a hole transport layer 3, an interlayer layer 16 and an organic light emitting layer 17. In addition, as a functional layer of an organic light emitting medium layer 26, a hole injection layer, an electron transport layer, an electron injection layer and the like can be preferably used besides a hole transport layer 3 and an interlayer layer 16.

After a partition wall 14 is formed, a hole transport layer 3 can be formed. In the case where an inorganic material is used for a hole transport material for a hole transport layer 3 in an embodiment of the present invention, a hole transport layer 3 can be formed by using the following metal oxides by a vacuum vapor deposition method, a sputtering method or a CVD method: $Cu_2O$, $Cr_2O_3$, $Mn_2O_3$, $FeOx$ (x~0.1), $NiO$, $CoO$, $Pr_2O_3$, $Ag_2O$, $MoO_2$, $Bi_2O_3$, $ZnO$, $TiO_2$, $SnO_2$, $ThO_2$, $V_2O_5$, $Nb_2O_5$, $Ta_2O_5$, $MoO_3$, $WO_3$ and $MnO_2$. However, usable materials are not limited to these. Carbide, nitride and boride thereof can be used.

In the case where a layer other than a hole transport layer 3 is an inorganic layer, an organic hole transport material for forming a hole transport layer 15 is as follows: poly aniline derivative, poly thiophenes, polyvinylcarbazole (PVK) derivative and poly(3,4-ethylenedioxy thiophene) (PEDOT). However, usable materials are not limited to these. A hole transport layer 3 is formed by dissolving or dispersing these materials in a solvent and applying it by various application methods using a spin coater etc. or a relief printing method.

Here, as shown in FIG. 1, hole transport layer 3 can be continuously formed over a plurality of places between partition walls 14 and a place of partition walls 14. Alternately, hole transport layer 3 can be formed while the hole transport layer 3 is divided by a partition wall 14.

In the case where hole transport layer 3 is continuously formed over a plurality of places between partition walls 14 and a place of partition walls 14 shown in FIG. 1, efficiency in the manufacturing process can be improved. On the other hand, in the case where hole transport layer 3 is formed while the hole transport layer 3 is divided by a partition wall 14, charge's escaping to an adjacent pixel are absolutely prevented.

After a hole transport layer 3 is formed, an interlayer layer 16 can be formed. Examples of materials used for an interlayer layer 16 in an embodiment of the present invention include polyvinylcarbazole, derivative of polyvinylcarbazole, polyarylene derivative having aromatic amine at a main chain or a side chain, and polymers having aromatic amine such as aryl amine derivative and triphenyl diamine derivative. However, usable materials are not limited to these. These materials are dissolved or dispersed in a solvent, and an interlayer layer 16 is formed by using the dissolved or dispersed material by various application methods using a spin coater etc. or a relief printing method. In addition, in the case where an inorganic material is used for a material of an interlayer layer 16, an interlayer layer 16 can be formed by using a metal oxide by a vacuum vapor deposition method, a sputtering method or a CVD method. An inorganic material for an interlayer layer 16 can be same as an inorganic material for a hole transport layer 3.

After an interlayer layer 16 has been formed, an organic light emitting layer 17 can be formed. An organic light emitting layer 17 in an embodiment of the present invention is a layer which emits light if an electric current flow through the layer.

Examples of organic light-emitting materials for forming the organic light emitting layer 17 include; 1. organic light-emitting materials in which light emitting color materials such as coumarin system, perylene system, pyran system, anthrone system, porphyrin system, quinacridone system, N,N'-dialkyl-substituted quinacridone system, naphthalimide system, N,N'-diaryl-substituted pyrrolopyrrole system and iridium complexes are dispersed in polymers such as polystyrene, polymethyl methacrylate and polyvinyl carbazole, 2. and polymeric organic light-emitting materials of polyarylene system, polyarylene vinylene system and polyfluorene system.

An organic light emitting ink is prepared by dissolving or stably dispersing these organic light emitting materials in a solvent. For a solvent dissolving or dispersing an organic light emitting material, toluene, xylene, acetone, anisole, methyl ethyl ketone, methyl isobutyl ketone and cyclohexanone can be used. The above-mentioned solvent may be used alone. In addition, the above mentioned solvent may be used as a mixed solvent. Above all, an aromatic organic solvent such as toluene, xylene and anisole is preferred from the aspect of solubility of an organic light emitting material. In addition, a surface active agent, an antioxidant, a viscosity modifier and an ultraviolet absorber may be added to an organic light emitting ink if necessary.

Figure 5:
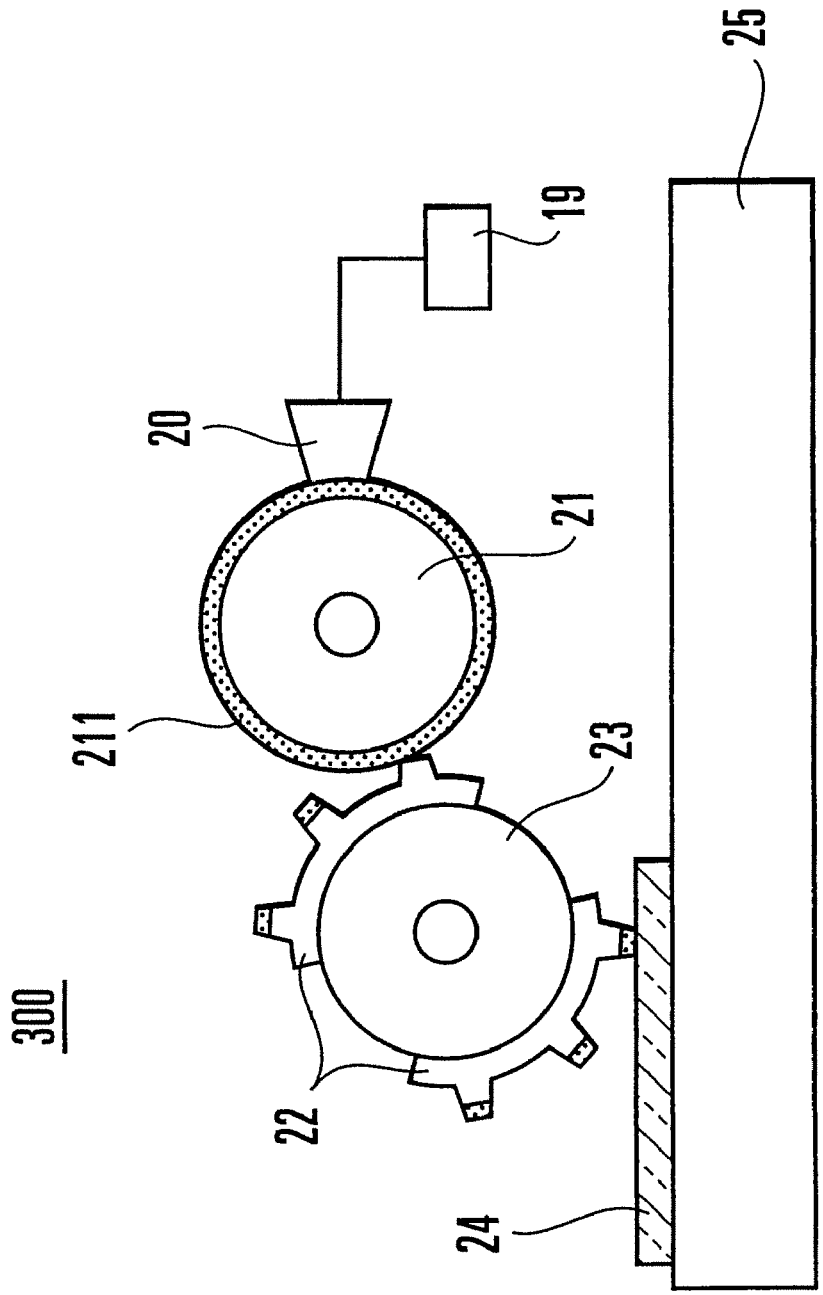
FIG. 5 is a schematic cross-sectional diagram of a relief printing apparatus used for the present invention.
Figure 6:
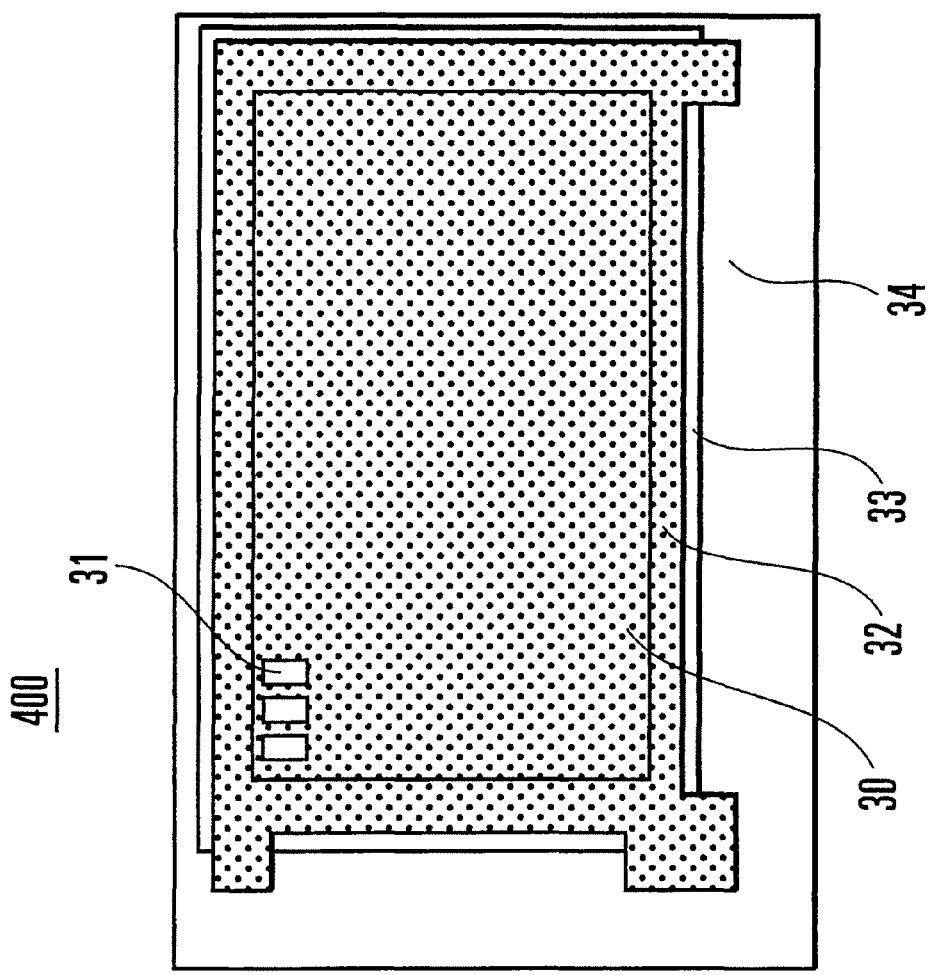
FIG. 6 is a schematic top view of a conventional organic EL display device.
Figure 7:
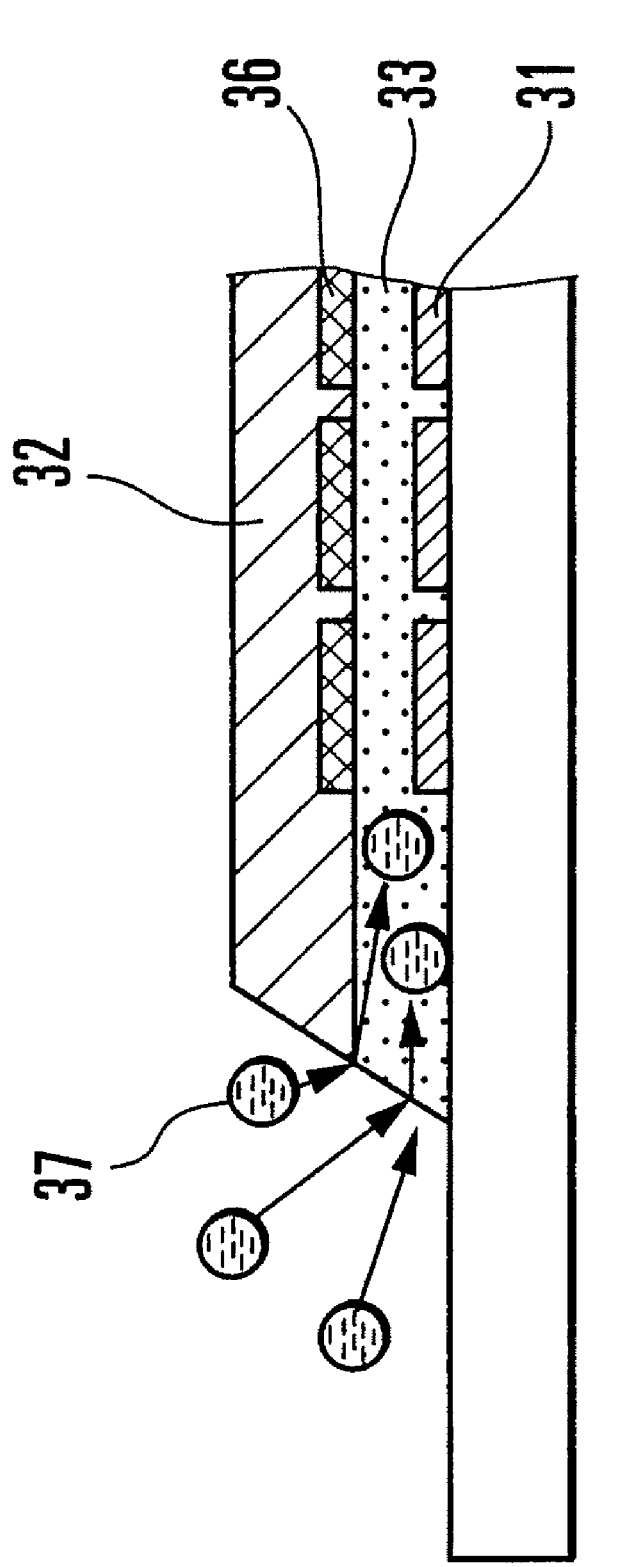
FIG. 7 is a schematic cross-sectional diagram showing an end part of a conventional organic EL display apparatus.

FIG. 5 shows a schematic diagram of a relief printing apparatus 300 which pattern-prints an organic light emitting ink comprising an organic light emitting material on a substrate to be printed 24 on which pixel electrodes 13, partition walls 14, a hole transport layer 3 and an interlayer layer 16 are formed. This relief printing apparatus 300 used in an embodiment of the present invention has an ink tank 19, an ink chamber 20, an anilox roll 21 and a plate cylinder 23 on which a relief printing plate is equipped. An organic light emitting ink which is diluted by a solvent is taken to the ink tank 19. An organic light emitting ink is sent into the ink chamber 20 from the ink tank 19. The anilox roll 21 makes contact with an ink feed section of the ink chamber 20, and it is rotatably supported.

According to rotation of the anilox roll 21, an ink layer 211 including an organic light emitting ink supplied on an anilox roll face becomes uniform. This ink layer transfers onto projection parts of the plate 22 mounted on a printing cylinder 23 which is rotationally driven in proximity to the anilox roll 21. A substrate to be printed 24 on which pixel electrodes 13 (transparent electrodes), a hole transport layer 3 and an interlayer layer 16 are formed is arranged on a flat base 25. And ink on projection parts of the plate 22 is printed on the substrate to be printed 24. And ink is dried if necessary. An organic light emitting layer 17 is formed on the substrate to be printed 24 in this way.

[Counter Electrode 2]

Next, counter electrode 2 which is a second electrode can be formed as illustrated by FIG. 1. When a counter electrode 2 is a cathode, the material discussed below can be used. The material can be of a type with high electron injection efficiency to an organic light emitting layer 17 and low work function.

In some embodiments, counter electrode 2 can include a metal such as Mg, Al, Yb. In addition, the following layer stack may be put in a boundary surface of the organic light emitting medium layer 26. The layer stack is a stack with a chemical compound of about 1 nm thicknesses such as Li and oxidation Li and LiF, and Al and Cu having stability and high conductivity. Stability should be balanced with electron injection efficiency. Therefore an alloy system may be used. An alloy of one or more kinds of metal such as Li, Mg, Ca, Sr, La, Ce, Er, Eu, Sc, Y, and Yb that have a low work function, and a metallic element such as Ag, Al, and Cu which are stable can be used. In some embodiments, alloys such as MgAg, AlLi, and CuLi can be used.

For the method for forming counter electrode 2, depending on the material, a resistance heating evaporation coating method, an electron beam-evaporation coating method, a reactive deposition method, an ion plating method, or a sputtering method can be used. However, the method for forming counter electrode 2 is not limited to these.

Figure 4A:
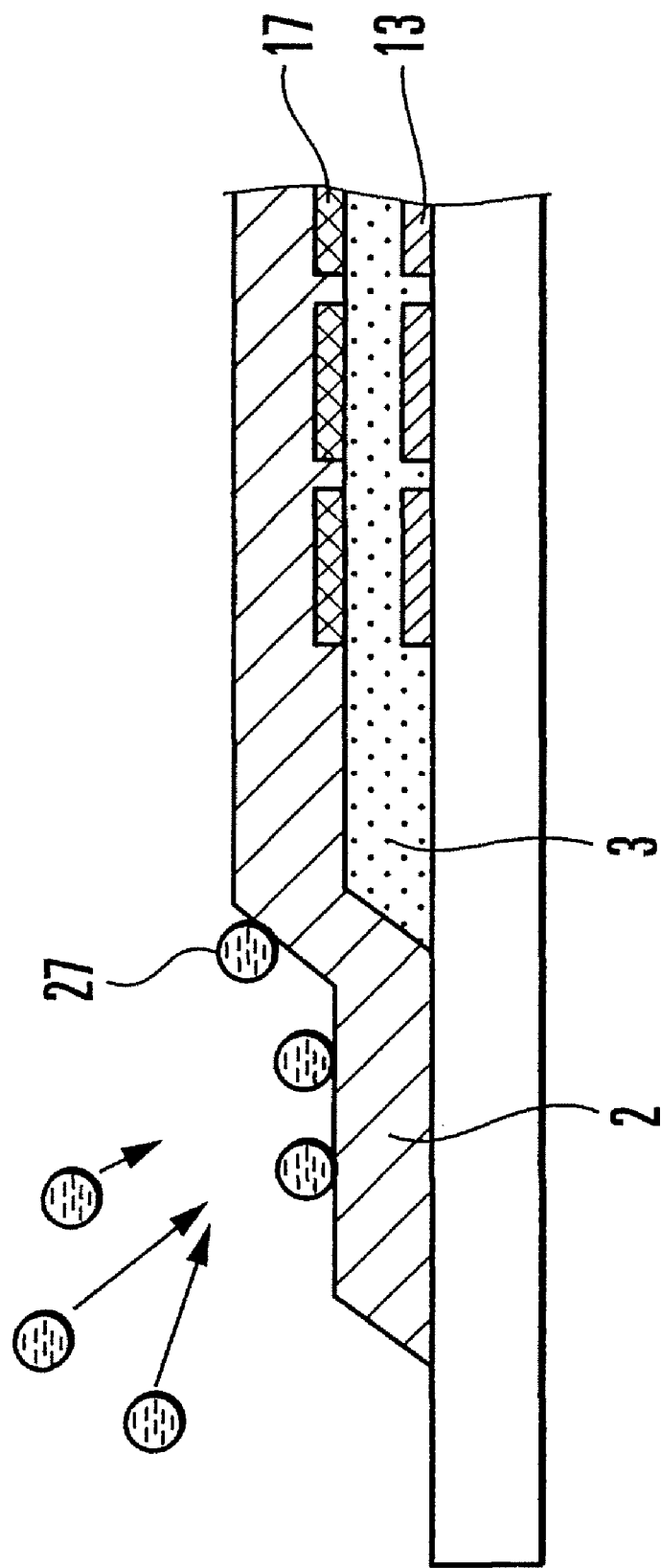
FIGS. 4A and 4B are schematic cross-sectional diagrams showing end parts of organic EL display devices of embodiments of the present invention.

FIG. 4A is a schematic cross-sectional diagram showing an end part of an organic EL display device 100. Since the entire surface of a hole transport layer 3 including an inorganic layer is covered by a counter electrode 2, a surface or an end part of an inorganic layer do not react with oxygen or moisture 27. Therefore, dark spots do not occur, and an organic EL display device 100 without a display failure can be obtained. Further, since a film thickness of a counter electrode 2 is equal to or more than a film thickness of an inorganic layer, an inorganic layer at a pattern end part can be completely covered by a material of a counter electrode 2. Thereby, durability of an organic EL display device 100 can be improved.

Figure 4B:
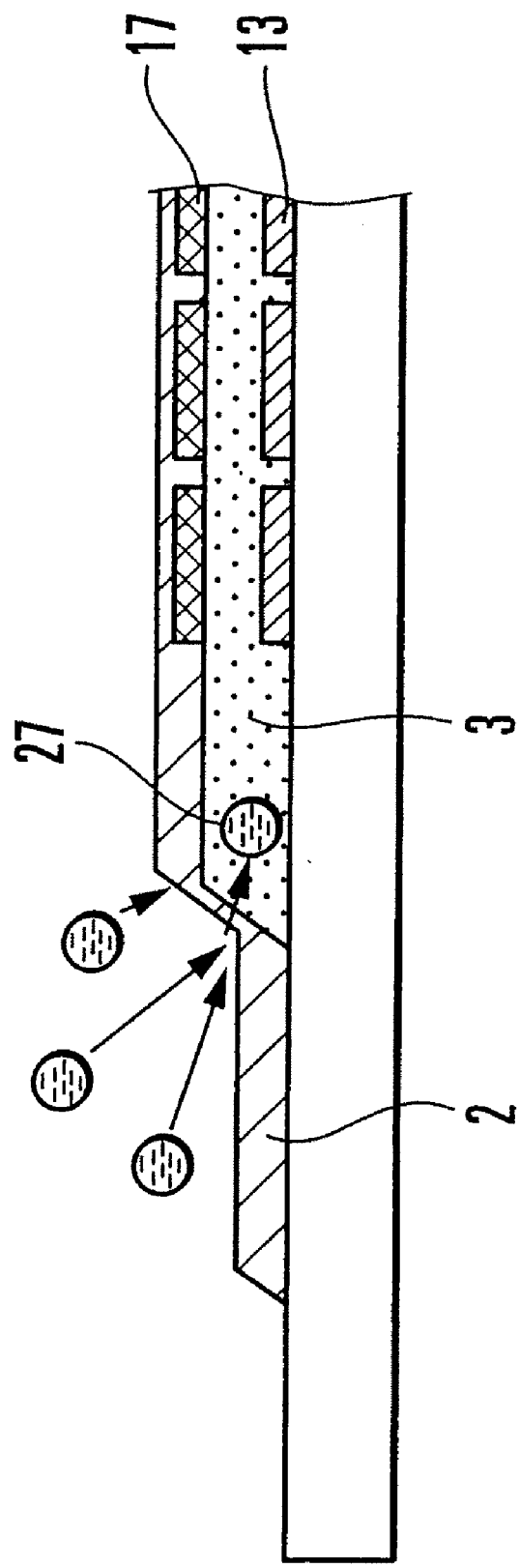

As shown in FIG. 4B, in the case where a film thickness of a counter electrode 2 is less than 80 nm, oxygen or moisture 27 enter an inorganic layer. Therefore, dark spots occur. Further, in the case where a film thickness of a counter electrode 2 is less than a film thickness of an inorganic layer, oxygen or moisture 27 enter an inorganic layer, and the durability is reduced.

Figure 3:
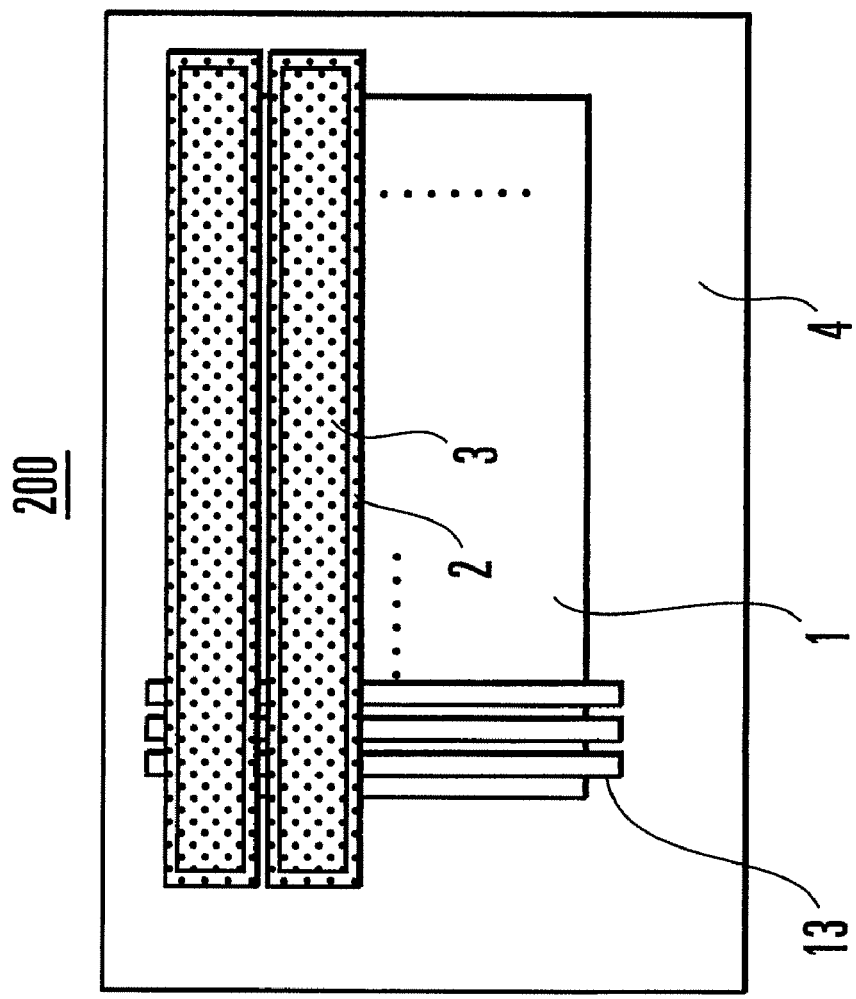
FIG. 3 is a schematic top view of a passive matrix driving type organic EL display device of an embodiment of the present invention.

An active matrix-drive type organic EL display device 100 is described above. However, the present invention is suitable for a passive matrix-drive type organic EL display 200, comprising a first electrode (a pixel electrode 13), a second electrode (a counter electrode 2) and an organic light emitting medium layer 26 between both electrodes, wherein both electrodes are an anode line and a cathode line which cross each other respectively. For example, as shown in FIG. 3, by providing a counter electrode 2 at an upper part of a stripe-shaped hole transport layer 3 including an inorganic layer, the same effect as the active matrix-drive type organic EL display 100 can be achieved. In addition, FIG. 3 shows only an inorganic layer among an organic light emitting medium layer 26.

[Sealing Body]

As an organic EL display device 100, a light emitting material is sandwiched between electrodes (pixel electrode 13 and counter electrode 2), and it can emit light by applying an electric current. However, an organic light emitting material deteriorates easily by means of atmospheric moisture and oxygen. Thus a seal (not illustrated in figures) to block off an organic light emitting layer and the like from the outside can be usually provided. For example, a sealing body can be manufactured by providing a resin layer on a sealing medium.

For a sealing medium, it is necessary for the permeability of moisture and oxygen to be low. In addition, as an example of a material for a sealing medium, ceramics such as alumina, silicon nitride and boron nitride, glass such as no-alkali glass and alkali glass, quartz, and humidity resistance film are exemplified. For example, the following humidity resistance film is exemplified: a film in which SiOx is formed by CVD method on both sides thereof; a film in which a film having a low permeability of moisture and oxygen and a hydrophilic film are laminated; and a film in which water absorption agent was applied thereon, the film having a low permeability of moisture and oxygen. It is preferable for water vapor permeation rate of the humidity resistance film to be equal to or less than $10^{-6}$ g/m$^2$/day.

For example, for a resin layer, the following material can be used: A photo-curing adhesive property resin, a heat curing adhesive property resin and two fluid hardening adhesive property resins including an epoxy type resin, acrylic resin, silicone oil or the like, acrylic resin such as ethylene ethylacrylate (EEA) polymer, vinyl resins such as ethylene vinyl acetate (EVA), thermoplastic resin such as polyamide, synthetic rubber, and thermoplasticity adhesive property resins such as acid denatured substances of polyethylene or polypropylene.

An example of a method for forming a resin layer on a sealing medium is shown below: solvent solution method, pushing out laminate method, fusion/hot melt method, calender method, discharge jet application method, screen printing, vacuum laminate method and heated roll laminate method. However, the method for forming a resin layer is not limited to these. A material having hygroscopicity and a property to absorb oxygen can be incorporated into a resin layer if necessary. The thickness of a resin layer formed on a sealing medium is decided by the size and configuration of a sealed organic EL display device 100. About 5-500 μm is desirable for the thickness of a resin layer. In addition, here, a resin layer is formed on a sealing medium. However, a resin layer can be directly formed on an organic EL display device 100 side.

Finally, in a sealing room, an organic EL display device 100 is affixed to a sealing body. When it is a two layer construction consisting of a sealing medium and a resin layer of thermoplastic resin, contact bonding is preferably performed only by a heating roller.

In the case of a heat curing type adhesion resin, it is desirable that a heat curing type adhesion resin be heated and hardened at a curing temperature after the resin is attached by pressure using a heating roller. In the case of a photo-curing-related adhesion resin, it is sealed by pressure using a roller. Thereafter, a photo-curing-related adhesion resin can be cured by irradiating light.

In the present invention, since the entire surface of a film made from an inorganic material is covered by a counter electrode 2, a surface and an end part of a film of an inorganic layer do not react with oxygen or moisture. Therefore, an organic EL display device and a method for manufacturing the device can be provided, in which dark spots do not occur, display defects do not occur and the durability can be improved.

Example 1

An active matrix substrate 5 was used which comprised: a thin film transistor, provided on a substrate 5, which functioned as a switching element; and a pixel electrode 13, provided over the transistor. As for the size of the substrate 5, the diagonal size was 5 inches and the number of pixels was 320*240.

A partition wall 14 was formed so that its shape allowed it to cover an end of the pixel electrode 13 provided on this substrate 5 and to section pixels. The partition wall 14 was formed by the following processes: a positive resist (ZWD6216-6: a product of ZEON CORPORATION) was formed on the entire surface of the substrate 5 by a spin coater so that the thickness of the resist was 2 μm; and the partition wall having a width of 40 μm was formed by patterning using a photolithography method. In this way, the pixel region was sectioned so that the number of sub pixel was 960×240 dot and the pitch was 0.12 mm×0.36 mm.

A pattern of molybdenum oxide of 50 nm thickness as a hole transport layer 3 was deposited on pixel electrodes 13 by a vacuum vapor deposition method using a shadow mask. Deposition was performed by using a metal mask having a opening of 120 mm×100 mm size so that the entire surface of a display region was deposited.

After the substrate to be printed 24 having the pixel electrode 13, the partition wall 14 and the hole transport layer 3 on the substrate 5 had been set on a relief printing apparatus 300, an interlayer layer 16 was printed by a relief printing method on the hole transport layer 3 between partition walls 14 by using an ink in which an interlayer layer material including polyvinyl carbazole derivative was dissolved in toluene, wherein the concentration of polyvinyl carbazole derivative was 0.5%. In this case, an anilox roll 21 of 300 lines/inch and a photosensitive resin printing plate which was developable by water were used. The film thickness of an interlayer layer 16 after printing and drying was 10 nm.

After the substrate to be printed 24 having the pixel electrode 13, the partition wall 14, the hole transport layer 3 and the interlayer layer 16 on the substrate 5 had been set on a relief printing apparatus 300, an organic light emitting layer 17 was printed by a relief printing method on the interlayer layer 16 between partition walls 14 by using an organic light emitting ink in which an organic light emitting material comprising polyphenylene vinylene derivative was dissolved in toluene, wherein the concentration of a polyphenylene vinylene derivative was 1%. In this case, an anilox roll 21 of 150 lines/inch and a photosensitive resin printing plate which was developable by water were used. The film thickness of an organic light emitting layer after printing and drying was 80 nm.

Thereafter, a Ca film was deposited to 20 nm thickness as a counter electrode 2 by a vacuum vapor deposition method using a metal mask having an opening of 120 mm×100 mm size. Thereafter, Al was deposited to 150 nm thickness using a metal mask having an opening of 124 mm×104 mm size in order to cover the entire surface of molybdenum oxide film (hole transport layer 3).

A glass plate as a sealing medium was put on the substrate so as to cover all light emitting areas, thereafter sealing was performed by curing an adhesive by heating at about 90° C. for 1 hr. When an active matrix-drive type organic EL display device 100 obtained in this way was driven, non-uniform luminance due to a resistance of counter electrode 2 did not appear and light emitting state was uniform.

Example 2

A sample of example 2 was manufactured by the same processes as example 1 before forming hole transport layer 3. A pattern of nickel oxide was deposited to 40 nm thickness as a hole transport layer 3 by a vacuum vapor deposition method using a shadow mask. Deposition was performed using a metal mask having an opening of 120 mm×100 mm size so that deposition was performed over the entire display region. In addition, an interlayer layer 16 and an organic light emitting layer 17 were formed by the same process as example 1.

Thereafter, a Ca film was deposited to 20 nm thickness as a counter electrode 2 by a vacuum vapor deposition method using a metal mask having an opening of 120 mm×100 mm size. Thereafter, Al was deposited to 150 nm thickness using a metal mask having an opening of 124 mm×104 mm size in order to cover the entire surface of nickel oxide film (hole transport layer 3).

A glass plate as a sealing medium was put on the substrate so as to cover all light emitting areas, thereafter sealing was performed by curing an adhesive by heating at about 90° C. for 1 hr. When an active matrix-drive type organic EL display device 100 obtained in this way was driven, non-uniform luminance did not appear and light emitting state was uniform.

Example 3

A sample of example 3 was manufactured by the same processes as example 1 before forming hole transport layer 3. A pattern of molybdenum oxide was deposited to 80 nm thickness as a hole transport layer 3 by a vacuum vapor deposition method using a shadow mask. Deposition was performed using a metal mask having an opening of 120 mm×100 mm size so that deposition was performed over the entire display region. In addition, an interlayer layer 16 and an organic light emitting layer 17 were formed by the same process as example 1.

Thereafter, a Ca film was deposited to 20 nm thickness as a counter electrode 2 by a vacuum vapor deposition method using a metal mask having an opening of 120 mm×100 mm size. Thereafter, Al was deposited to 80 nm thickness using a metal mask having an opening of 124 mm×104 mm size in order to cover the entire surface of molybdenum oxide film (hole transport layer 3).

Same as example 1, a glass plate as a sealing medium was put on the substrate so as to cover all light emitting areas, thereafter sealing was performed by curing an adhesive by heating at about 90° C. for 1 hr. When an active matrix-drive type organic EL display device 100 obtained in this way was driven, non-uniform luminance did not appear and light emitting state was uniform.

Comparative Example 1

A sample of comparative example 1 was manufactured by the same processes as example 1 before forming hole transport layer 3. A pattern of molybdenum oxide was deposited to 50 nm thickness as a hole transport layer 3 by a vacuum vapor deposition method using a shadow mask. Deposition was performed using a metal mask having an opening of 120 mm×100 mm size so that deposition was performed over the entire display region. In addition, an interlayer layer 16 and an organic light emitting layer 17 were formed by the same process as example 1.

Thereafter, a Ca film was deposited to 20 nm thickness as a counter electrode 2 by a vacuum vapor deposition method using a metal mask having an opening of 120 mm×100 mm size. Thereafter, Al was deposited to 50 nm thickness using a metal mask having an opening of 120 mm×100 mm size.

Same as example 1, a glass plate as a sealing medium was put on the substrate so as to cover all light emitting areas, thereafter sealing was performed by curing an adhesive by heating at about 90° C. for 1 hr. When an active matrix-drive type organic EL display device 100 obtained in this way was driven, non-uniform luminance did not appear and light emitting state was uniform.

Comparative Example 2

A sample of comparative example 2 was manufactured by the same processes as example 1 before forming hole transport layer 3. A pattern of molybdenum oxide was deposited to 50 nm thickness as a hole transport layer 3 by a vacuum vapor deposition method using a shadow mask. Deposition was performed using a metal mask having an opening of 120 mm×100 mm size so that deposition was performed over the entire display region. In addition, an interlayer layer 16 and an organic light emitting layer 17 were formed by the same process as example 1.

Figure 8:
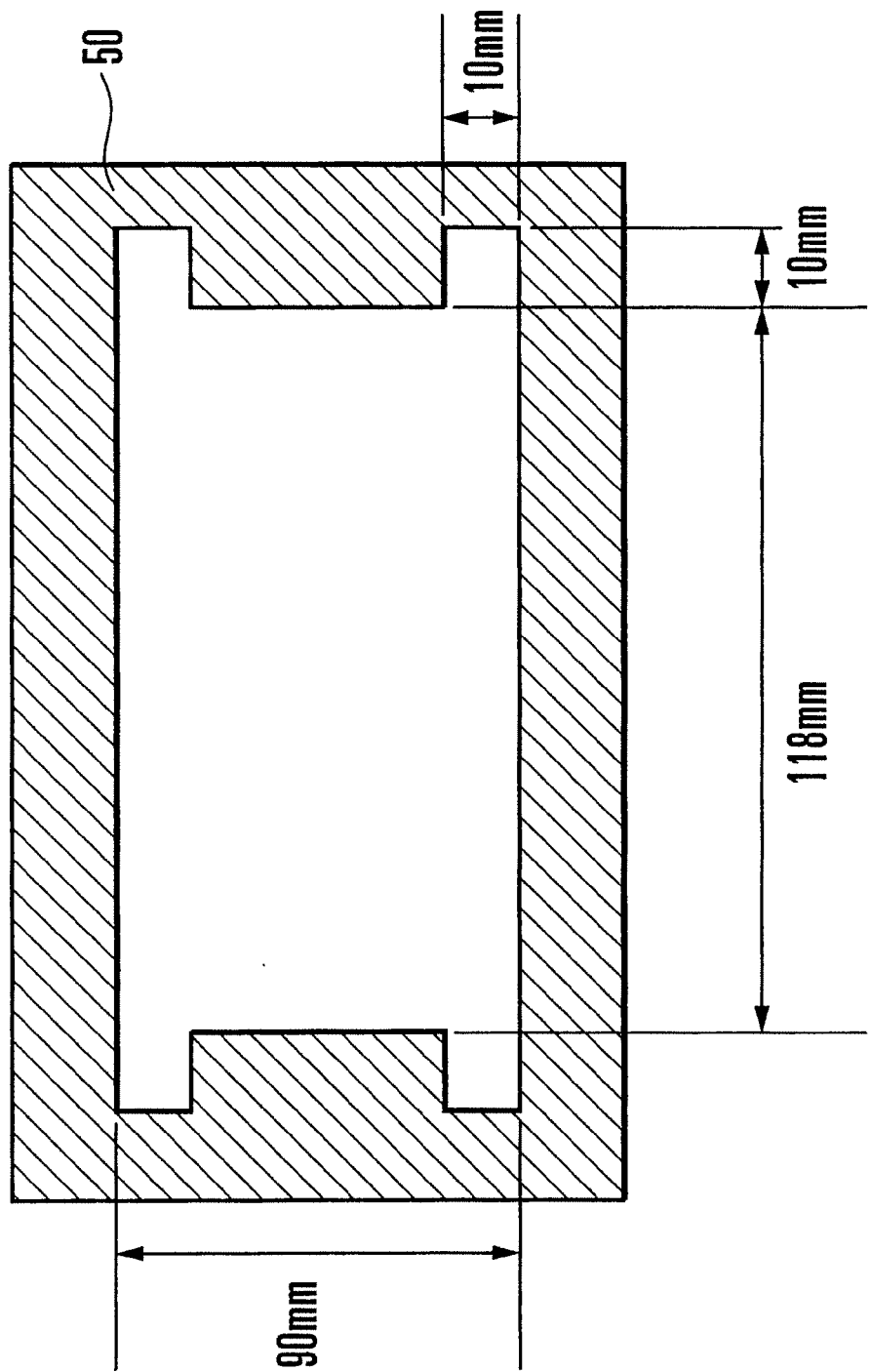
FIG. 8 is a plane view of a metal mask used in Comparative Example 2.

Thereafter, a Ca film of 20 nm thickness as a counter electrode 2 was deposited through a metal mask by a vacuum vapor deposition. At this time, the metal mask having the following opening shown in FIG. 8 was used: opening of 118 mm×90 mm which has continuously other openings of 10 mm×10 mm square at upper parts and lower parts of the both 90 mm sides respectively. The opening of 10 mm×10 mm is formed so that TFT substrate 5 is connected to a counter electrode 2. Thereafter, an Al film of 150 nm thickness was deposited by using the same metal mask. The use of this metal mask can allow a counter electrode to be formed at an inner side of a molybdenum oxide (hole transport layer 3) pattern region, except for the connection parts.

Same as example 1, a glass plate as a sealing medium was put on the substrate so as to cover all light emitting areas, thereafter sealing was performed by curing an adhesive by heating at about 90° C. for 1 hr. When an active matrix-drive type organic EL display device 100 obtained in this way was driven, non-uniform luminance did not appear and light emitting state was uniform.

Thereafter, a constant temperature and humidity test of samples of Examples 1-3 and Comparative Examples 1-2 was performed. When an accelerated test under 60 degrees Celsius and 90% humidity was performed, dark spots did not appear in samples of Examples 1-3 after 1000 hours passed. On the other hand, dark spots began to appear from outside of display regions in samples of Comparative Examples 1-2.

Forming a counter electrode 2 covering the entire surface of an inorganic layer could prevent a front surface and an end part of an inorganic layer from reacting with oxygen and moisture 27. Thereby, dark spots did not appear and an organic EL display device without display defects was obtained.

Further, in the case where a film thickness of a counter electrode 2 was equal to or more than a film thickness of an inorganic layer, a material of a counter electrode 2 could cover the entire surface of an inorganic layer including an end part of the inorganic layer. Thereby, durability of an organic EL display device is improved.

What is claimed is:

1. An organic EL display device, comprising:
   a substrate;
   a plurality of first electrodes formed on the substrate;
   a plurality of partition walls for sectioning the plurality of first electrodes and for locating the plurality of first electrodes in different pixels;
   a hole transport layer including an inorganic layer, the hole transport layer formed on an entire surface of a display region where the plurality of first electrodes and the plurality of partition walls are formed;
   an array of a plurality of organic light emitting layers formed on the hole transport layer such that each of the plurality of organic light emitting layers is located next to each other; and
   a second electrode covering an entire surface of the hole transport layer and the array of the plurality of organic light emitting layers,
   wherein an end part of the hole transport layer is completely covered by the second electrode.

2. The organic EL display device according to claim 1, wherein a film thickness of the second electrode is equal to or more than 80 nm.

3. The organic EL display device according to claim 1, wherein a film thickness of the second electrode is equal to or more than a film thickness of the inorganic layer.

4. The organic EL display device according to claim 1, wherein a material for the inorganic layer is a metal oxide.

5. The organic EL display device according to claim 1, wherein a height of the partition wall is 0.1 μm-10 μm.

6. A method for manufacturing an organic EL display device, comprising:
   preparing a substrate;
   forming a plurality of first electrodes on the substrate;
   forming a plurality of partition walls so that the partition walls section the plurality of first electrodes and the plurality of first electrodes are located in different pixels;
   forming a hole transport layer including an inorganic layer, the hole transport layer being formed on an entire surface of a display region where the plurality of first electrodes and the plurality of partition walls are formed;
   forming an array of a plurality of organic light emitting layers on the hole transport layer such that each of the plurality of organic light emitting layers is located next to each other; and
   forming a second electrode covering an entire surface of the hole transport layer and the array of the plurality of organic light emitting layers;
   such that the second electrode completely covers an end part of the hole transport layer.

7. The method for manufacturing the organic EL display according to claim 6,
   wherein a film thickness of the second electrode is equal to or more than 80 nm.

8. The method for manufacturing the organic EL display according to claim 6,
   wherein a film thickness of the second electrode is equal to or more than a film thickness of the inorganic layer.

9. The method for manufacturing the organic EL display according to claim 6,
   wherein a material of the inorganic layer is a metal oxide.

10. The method for manufacturing the organic EL display according to claim 6,
    wherein a height of the partition wall is 0.1 μm-10 μm.

11. The method for manufacturing the organic EL display according to claim 6,
    wherein at least one layer of the first electrode, the partition wall, the hole transport layer, the organic light emitting layer and the second electrode is formed by a wet process.

12. The organic EL display device according to claim 1, wherein an area where the second electrode is formed is larger than an area where the hole transport layer is formed.

13. The method for manufacturing the organic EL display according to claim 6, wherein the hole transport layer and the second electrode are respectively formed by depositing inorganic materials using a mask for each, and a size of the mask for the second electrode is larger than a size of the mask for the hole transport layer.

14. An organic EL display device, comprising:
    a substrate;
    a plurality of first electrodes formed on the substrate;
    a plurality of partition walls for sectioning the plurality of first electrodes and for locating the plurality of first electrodes in different pixels;
    a hole transport layer including an inorganic layer, the hole transport layer formed on an entire surface of a display region where the plurality of first electrodes and the plurality of partition walls are formed;
    a plurality of interlayer layers formed on the hole transport layer between the plurality of partition walls;
    a plurality of organic light emitting layers formed on the plurality of interlayer layers;
    each of the plurality of organic light emitting layers is located next to each other; and
    a second electrode covering an entire surface of the hole transport layer and the plurality of organic light emitting layers,
    wherein an end part of the hole transport layer is completely covered by the second electrode.

15. The organic EL display device according to claim 14, wherein a film thickness of the second electrode is equal to or more than 80 nm.

16. The organic EL display device according to claim 14, wherein a film thickness of the second electrode is equal to or more than a film thickness of the inorganic layer.

17. The organic EL display device according to claim 14, wherein a material for the inorganic layer is a metal oxide.

18. The organic EL display device according to claim 14, wherein a height of the partition wall is 0.1 μm-10 μm.

19. The organic EL display device according to claim 14, wherein an area where the second electrode is formed is larger than an area where the hole transport layer is formed.

* * * * *